(12) United States Patent
Rae et al.

(10) Patent No.: US 10,502,816 B2
(45) Date of Patent: Dec. 10, 2019

(54) RANGING APPARATUS

(71) Applicants: STMicroelectronics (Research & Development) Limited, Marlow, Buckinghamshire (GB); STMicroelectronics (Grenoble 2) SAS, Grenoble (FR)

(72) Inventors: Bruce Rae, Edinburgh (GB); Pascal Mellot, Lans en Vercors (FR); John Kevin Moore, Edinburgh (GB); Graeme Storm, Kirkliston (GB)

(73) Assignees: STMicroelectronics (Research & Development) Limited, Marlow (GB); STMicroelectronics (Grenoble 2) SAS, Grenoble (FR)

( * ) Notice: Subject to any disclaimer, the term of this patent is extended or adjusted under 35 U.S.C. 154(b) by 419 days.

(21) Appl. No.: 15/168,535

(22) Filed: May 31, 2016

(65) Prior Publication Data

US 2017/0176578 A1    Jun. 22, 2017

(30) Foreign Application Priority Data

Dec. 18, 2015   (EP) .................................... 15307058

(51) Int. Cl.
| | | |
|---|---|---|
| *G01S 7/48* | (2006.01) | |
| *G01S 17/00* | (2006.01) | |
| *G01S 17/10* | (2006.01) | |
| *G01S 17/58* | (2006.01) | |
| *G01S 17/87* | (2006.01) | |

(Continued)

(52) U.S. Cl.
CPC ............ *G01S 7/4863* (2013.01); *G01S 7/487* (2013.01); *G01S 7/4865* (2013.01); *G01S 7/497* (2013.01); *G01S 17/003* (2013.01); *G01S 17/10* (2013.01); *G01S 17/102* (2013.01); *G01S 17/58* (2013.01); *G01S 17/87* (2013.01); *G01S 17/88* (2013.01); *G01S 17/89* (2013.01);

(Continued)

(58) Field of Classification Search
CPC .......... G01S 17/10; G01S 17/42; G01S 17/89; G01S 7/4816; G01S 7/4817; G01S 7/4863; G01S 17/48; H04N 5/2256
See application file for complete search history.

(56) References Cited

U.S. PATENT DOCUMENTS

| | | | | |
|---|---|---|---|---|
| 2014/0078491 A1* | 3/2014 | Eisele | ................... | G01S 7/4863 356/4.07 |
| 2015/0285625 A1* | 10/2015 | Deane | ..................... | G01S 17/10 348/140 |

FOREIGN PATENT DOCUMENTS

| | | | |
|---|---|---|---|
| GB | 2485997 | * | 6/2012 |
| GB | 2485997 A | | 6/2012 |
| GB | 2510891 A | | 8/2014 |

OTHER PUBLICATIONS

EPO Search Report and Written Opinion for EP 15307058.6 dated Jun. 7, 2016 (9 pages).

(Continued)

*Primary Examiner* — Luke D Ratcliffe
(74) *Attorney, Agent, or Firm* — Crowe & Dunlevy

(57) ABSTRACT

A ranging apparatus includes an array of light sensitive detectors configured to receive light from a light source which has been reflected by an object. The array includes a number of different zones. Readout circuitry including at least one read out channel is configured to read data output from each of the zones. A processor operates to process the data output to determine position information associated with the object.

26 Claims, 10 Drawing Sheets

(51) Int. Cl.
- *G01S 17/89* (2006.01)
- *G01S 7/487* (2006.01)
- *G01S 7/497* (2006.01)
- *G01S 17/88* (2006.01)
- *H01L 27/144* (2006.01)
- *H01L 31/107* (2006.01)
- *H01L 31/16* (2006.01)

(52) U.S. Cl.
CPC ...... *H01L 27/1443* (2013.01); *H01L 27/1446* (2013.01); *H01L 31/107* (2013.01); *H01L 31/165* (2013.01)

(56) References Cited

OTHER PUBLICATIONS

First Office Action and Search Report from co-pending CN Appl. No. 201610270024.8 dated Dec. 25, 2018 (9 pages).

\* cited by examiner

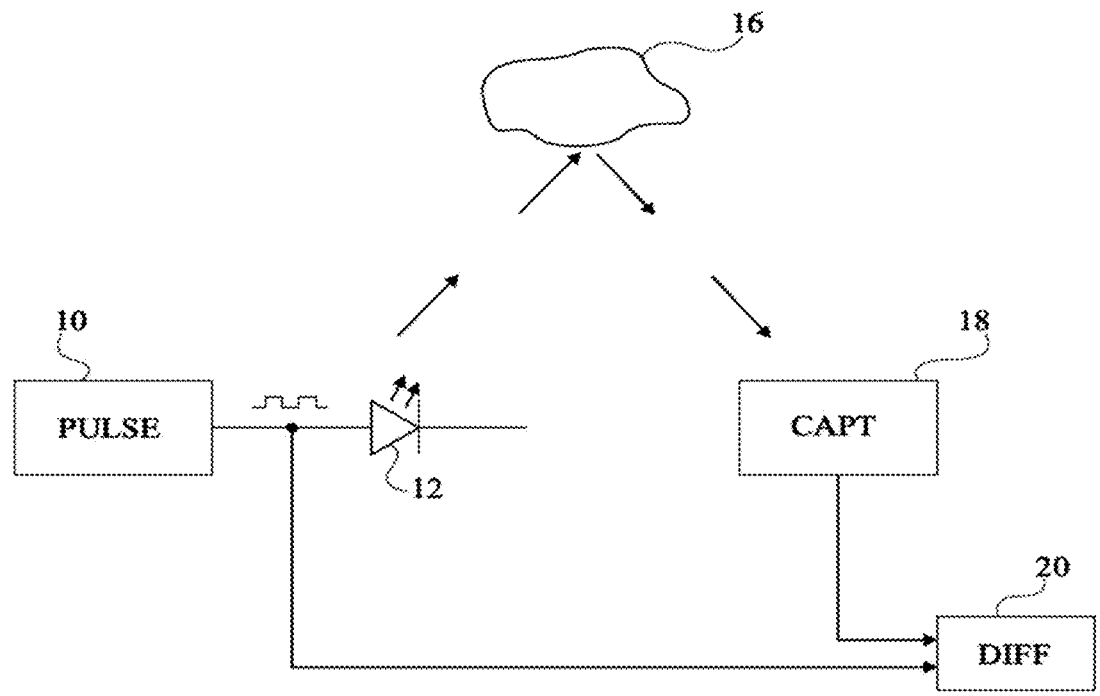
Figure 1
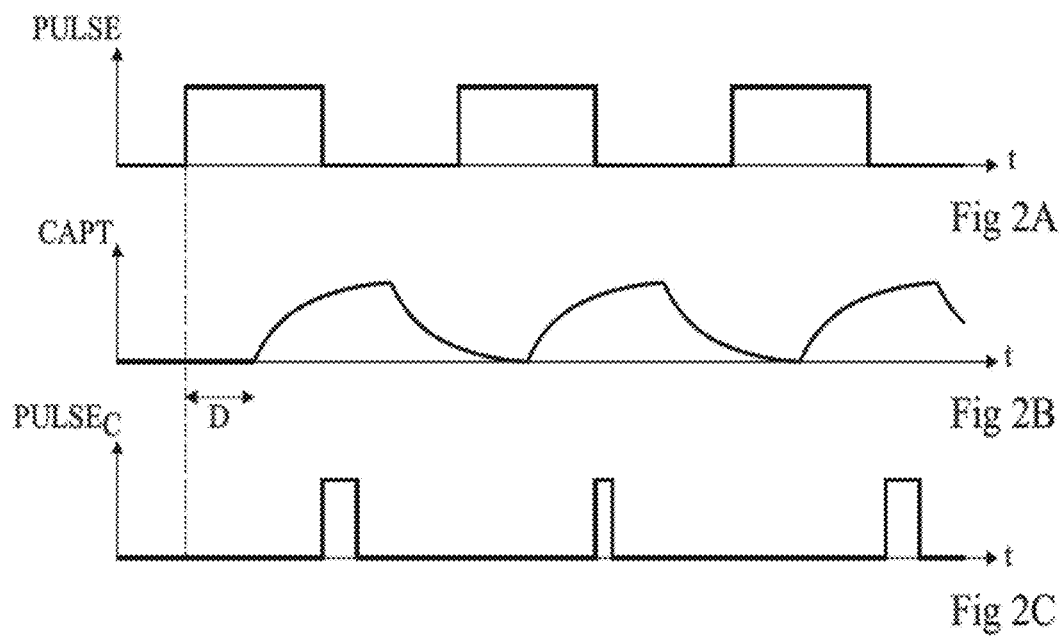
Fig 2A
Fig 2B
Fig 2C

RANGING APPARATUS

PRIORITY CLAIM

This application claims priority from European Application for Patent No. 15307058.6 filed Dec. 18, 2015, the disclosure of which is incorporated by reference.

TECHNICAL FIELD

Some embodiments relate to a ranging apparatus and in particular but not exclusively to an apparatus which is able to provide gesture detection.

BACKGROUND

Devices for determining the distance to objects are known. One currently used method is called "Time of Flight" (ToF). This method comprises sending a light signal towards the object and measuring the time taken by the signal to travel to the object and back. The calculation of the time taken by the signal for this travel may be obtained by measuring the phase shift between the signal coming out of the light source and the signal reflected from the object and detected by a light sensor. Knowing this phase shift and the speed of light enables the determination of the distance to the object.

Single photon avalanche diodes (SPAD) may be used as a detector of reflected light. In general an array of SPADs are provided as a sensor in order to detect a reflected light pulse. A photon may generate a carrier in the SPAD through the photo electric effect. The photo generated carrier may trigger an avalanche current in one or more of the SPADs in an SPAD array. The avalanche current may signal an event, namely that a photon of light has been detected.

SUMMARY

According to an aspect, there is provided a ranging apparatus comprising: a first array of a plurality of light sensitive detectors configured to receive light from a light source which has been reflected by an object, said first array comprising a plurality of different zones; a readout circuitry having at least one read out channel, and configured to read out data from each of said plurality of zones; and a processor configured in dependence on said outputs from the first array to determine position information associated with said object.

The first array may comprise a field of view, with each zone being associated with a sub area in said field of view, said processor may be configured to determine a position of said object with respect to one or more of said sub areas.

The processor may be configured to determine movement of said object by using successive data output by said zones. In some embodiments gestures may be recognized.

The first array may comprise n zones and said readout circuitry may comprise n readout channels.

The first array may comprise n zones and said readout circuitry may comprise m readout channels, where m is less than n, said readout circuitry configured to readout from at least two zones of said first array serially.

The apparatus may comprise a second array, said second array configured to provide a reference value, said readout circuitry configured to read out data from said second array.

The second array may comprise a plurality of different zones.

The second array may comprise a same number of zones as the first array.

The light sensitive detectors may comprise SPADS.

The apparatus may comprise address circuitry for individually addressing said light sensitive detectors.

The addressing circuitry may be configured to define one or more of said zones.

The address circuitry may be configured to defining one or more sub zones, said read out circuitry configured to read out said data from said one or more sub-zone, wherein the or each sub-zone comprises a part of at least one zone.

The addressing circuitry may be configured to dynamically define at least one of: said one or more zones; and said one or more sub-zone dynamically.

The apparatus may comprise said light source configured to emit light.

According to another aspect, there is provided an integrated circuit comprising: a first array of a plurality of light sensitive detectors configured to receive light from a light source which has been reflected by an object, said first array comprising a plurality of different zones; and a readout circuitry having at least one read out channel, and configured to read out data from each of said plurality of zones.

BRIEF DESCRIPTION OF THE DRAWINGS

Some embodiments will now be described by way of example only and with reference to the accompanying Figures in which:

FIG. 1 illustrates principle of the "Time of Flight" method for determining the distance to an object;

FIGS. 2A to 2C are timing diagrams illustrating results obtained by means of the device of FIG. 1, as well the operation of "SPADs";

DETAILED DESCRIPTION

Figure 3:
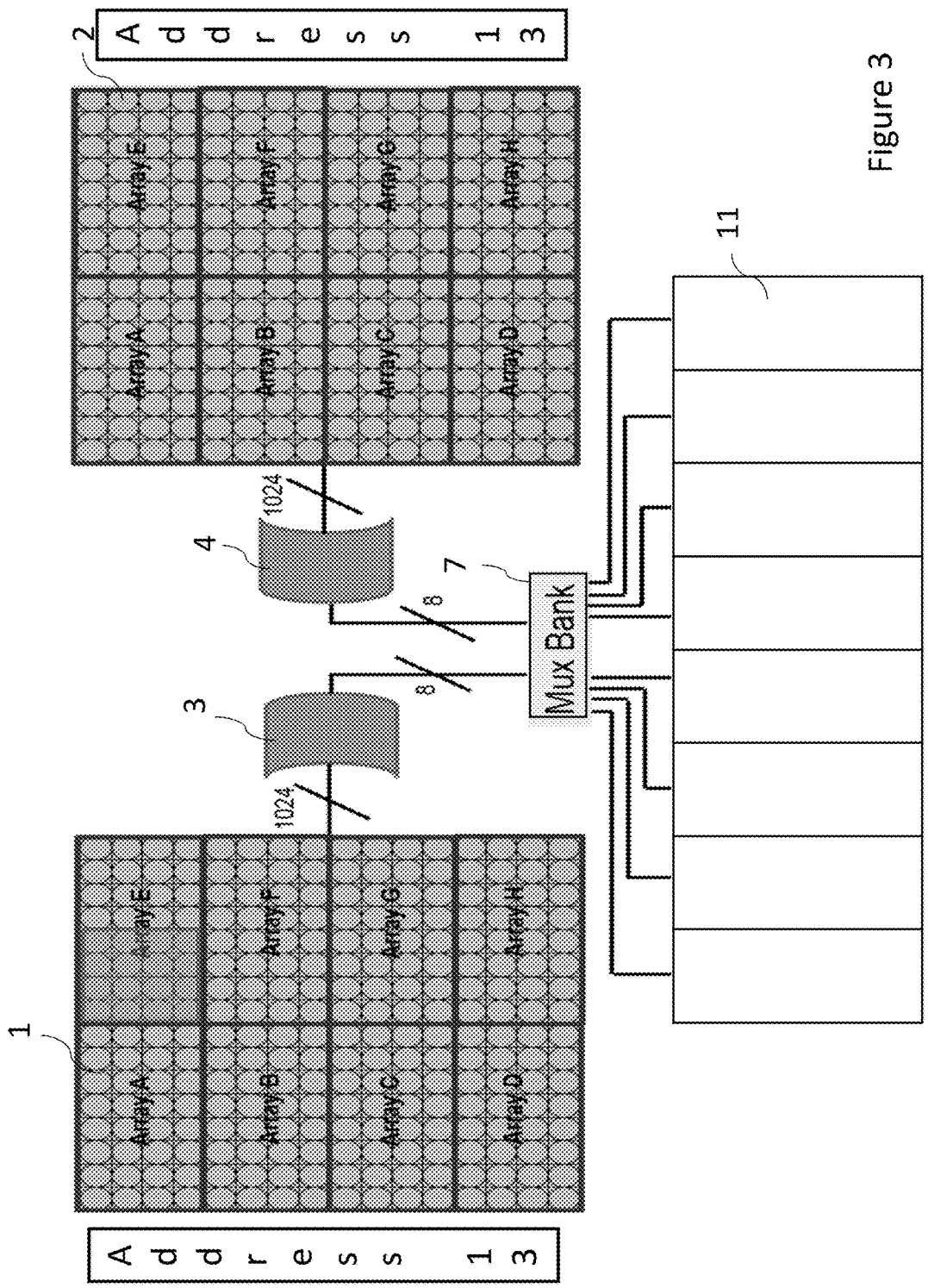
FIG. 3 shows a block diagram of an embodiment.

FIG. 1 illustrates the general principle of a "Time of Flight" method.

In FIG. 1, a generator 10 (PULSE) provides a periodic electric signal, for example, square-wave shaped. This signal powers a light source 12. An example of a light source 12 may be a light-emitting diode, or any known lighting device, for example, a laser diode. The signal coming out of light source 12 is transmitted towards an object 16 and is reflected by this object. The reflected light signal is detected by a light sensor 18 (CAPT). The signal on sensor 18 is thus phase-shifted from the signal provided by the generator by a time period proportional to twice the distance to object 16.

Calculation block 20 (DIFF) receives the signals generated by generator 10 and by sensor 18 and calculates the phase shift between these signals to obtain the distance to object 16.

In some embodiments, a reference sensor is used. The reference sensor will be positioned so as to receive the light emitted by the light source, and is close to the light source. The distance to the object may be determined using the timing difference between the reference sensor receiving the light from the light source and the sensor 18 receiving the light from the reflected object.

FIGS. 2A to 2C are timing diagrams illustrating the operation of a circuit such as that in FIG. 1. FIG. 2A illustrates a periodic signal PULSE capable of being provided by the generator 10 of FIG. 1. FIG. 2B illustrates the signal CAPT received by sensor 18. Due to interactions with the outside and to the components forming sensor 18, the signal received by this sensor has, in this example, variations in the form of capacitor charges and discharges. The signal on sensor 18 is phase-shifted from the signal coming out of generator 10 by a delay D.

The sensor 18 may integrate one or several photo detection elements enabling the detection of the signal received after reflection from the object 16. Such elements may be rapid charge transfer photodiodes. Single-photon avalanche diodes, or "SPADs", also called Geiger mode avalanche photodiodes, may also be used. These devices have a reverse biased p-n junction in which a photo-generated carrier can trigger an avalanche current due to an impact ionization mechanism. SPADs may be designed to operate with a reverse bias voltage well above the breakdown voltage.

FIG. 2C illustrates the signal (PULSE) generated by sensor 18, in the case where this sensor contains such a SPAD.

SPADs operate as follows. At an initial time, the diode is biased to a voltage larger than its breakdown voltage. The reception of a photon in the diode junction area starts an avalanche in the diode, which creates an electric pulse. The diode is then biased back to a voltage smaller than the breakdown voltage, so that the SPAD reacts again to the reception of a photon. SPADs can currently be used in cycles having reactivation periods shorter than 10 ns. Thereby, SPADs can be used at high frequency to detect objects at relatively short distances from the measurement device, for example, distances ranging from a few centimeters to a few tens of centimeters. In different embodiments, different ranges may be supported.

As illustrated in FIG. 2C, if SPADs receive a light signal such as described in relation to FIG. 2B, the diode avalanche time may vary with respect to this signal. The graph of the number of pulses versus time reflects the power-time profile of the light received by the SPAD. Thus, in the case illustrated in FIGS. 2A to 2C, on a large number of acquisitions, the graph of the pulse transmission by the SPAD substantially follows the curve of FIG. 2B.

To obtain information relative to the distance to an object, a circuit and a method using data obtained from a device will now be described. Ranging is the obtaining of distance information. This may be relative distance or a more precise distance.

Reference is now made to FIG. 3 which schematically shows an overview of an embodiment. The arrangement comprises a first SPAD array 1 and a second SPAD array 2. Each SPAD array comprises a plurality of SPAD devices. Each SPAD array is made up of eight zones. These zones are referenced A to H respectively.

In some embodiments, the zones may be pre-defined. However, as will be discussed in more detail, the zones may be variably configured. In some embodiments, the number of zones and/or the size of the zones may be variably configured.

In the example shown in FIG. 3, the arrays are shown as having the same number of zones. In other embodiments, the arrays may have different numbers of zones to each other.

In some embodiments, the number of zones and/or the sizes of the zones may be configured for the device's usage when the device is in the manufacture/configuration stage.

In other embodiments, the number of zones and/or the sizes of zones may be changed during the operation of the device. In some embodiments a zone may be dynamically configured during operation of a device. This may be used to track an object of interest in some embodiments.

The number of zones can be scaled in some embodiments.

The position and/or size of each zone can be dynamically changed in some embodiments.

Those embodiments which allow dynamic changes to the position and/or size of a zone may make use of the addressing circuitry 13 to facilitate this. In particular, the addressing circuitry is configured to control which part of an array defines a particular zone. This may be done for one or more zones of the array.

In the described embodiment, each array is described as having eight zones. However, this is by way of example only and in different embodiments, the number of zones may be more or less than eight.

Each zone is provided with its own dedicated output path, in some embodiments. The respective outputs from each of the zones is provided to an OR-tree 3 in the case of the first array 1 and an OR tree 4 in the case of the second array 2. The output of the respective OR trees 3 and 4 are provided to a multiplexer bank 7. The multiplexer bank 7 provides 8 parallel readout channels 11 or banks. Each readout channel or bank will receive the output from a respective zone.

A processor 16 may be provided to receive the data from all of the readout banks and to process that data to determine position information.

In some embodiments, a channel or readout bank may be provided for each of the 16 zones. Thus, there would be, for example, 16 readout channels. In some embodiments, there may be fewer readout channels than there are zones in a particular array. In that scenario, a time division multiplexing technique would be used to read out the different zones of a particular array. The number of readout channels shown in FIG. 3 is by way of example only and different embodiments may be provided with different numbers of channel, less than or greater than eight. In some embodiments, a single readout channel could be provided, with the different zones being readout in a time multiplexed manner.

The channel or readout banks will thus capture the information provided by the SPAD arrays in order to allow the determination of distance information.

In some embodiments, one array acts as a reference array. This will capture the light when it is emitted by the light source. This will act as a reference point against which the time taken for the light from the light source which is reflected from an object to be received by the other (so-called return array) is compared.

In other embodiments, both of the arrays will capture light which is reflected from an object. The two SPAD arrays and associated circuitry can be used to provide a stereoscopic perspective. Each of the arrays is able to capture a reflected beam and the interspatial distance may be used to provide a stereoscopic perspective.

In the embodiment shown in FIG. 3, the two arrays are shown as being the same size. In other embodiments, the arrays may be of different size. For example if one of the arrays is being used as a reference array, that array may be smaller than the return array.

The multiplexer bank 7 allows different combinations of the 16 available zones to be passed to the eight channels or readout banks 11. In some embodiments, the zones of one array may be read out together followed by the zones of the other array being read out together. However, in other embodiments, any of the 16 the zones can be selected. For example, the outputs from zone A, B, C and D of the first zone and zones E, F, G and H of the second zone may be passed at the same time to the eight readout banks.

The readout banks and processor may be configured to convert the SPAD array data into histogram data and optionally range estimates. In some embodiments, the readout banks may provide output data to the processor 16 which is configured to provide the range estimates or gesture recognition as will be discussed in more detail later.

In other embodiments, any other suitable technique may be used to determine the distance information.

In some embodiments, each SPAD in the array may be configured to be individually addressable. In this regard, each array is provided with addressing circuitry 13. This function may be provided in order to switch out malfunctioning SPADs. In some embodiments, by individual addressing, it is possible to interrogate additional sub zones using this addressing and accessing these SPADs serially. In some embodiments the sub zones may be within in a single zone. In other embodiments, a further defined zone may be in two or more zones. Where a further zone is in more than two zones, that further zone may comprise one or more of those zones partially or completely.

In the embodiment shown, an OR tree for each array is shown. In some embodiments, more than one OR-tree may be provided for each array. The OR-trees may all provide outputs to the multiplexer bank. Each OR tree may be configured to receive the outputs of particular zones.

With the arrangement shown in FIG. 3, gesture detection and/or multi-zone time of flight may be achieved. Some embodiments may allow the parallel acquisition of range and signal intensity values from within a system field of view. Some embodiments may allow multiple zones of interest to be evaluated without the need for time interleaved measurements. This may increase the rate at which data from across all zones can be gathered. This may mean that faster gestures may be captured.

One or both of the arrays may be provided on a single die or integrated circuit.

In embodiments movement data collected for one or more objects in a time frame is compared to one or more reference data. If the movement data matches one reference data, a gesture associated with the reference data may be recognized.

In some embodiments, the second array may be omitted.

Figure 4A:
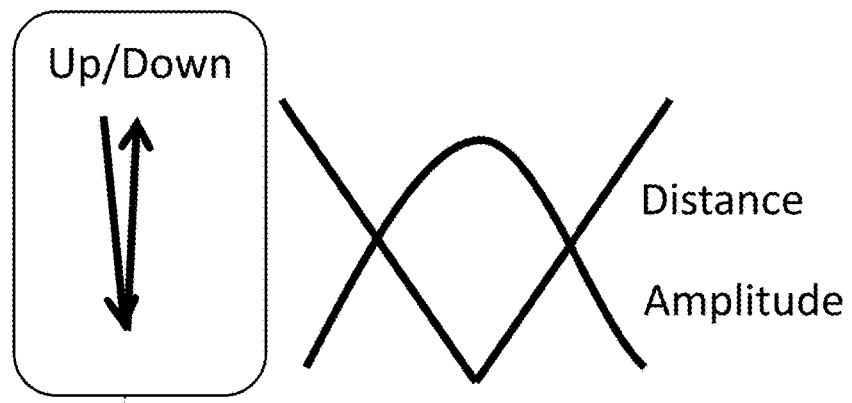
FIGS. 4A and 4B show some examples of gestures and associated amplitude and distance.
Figure 4B:
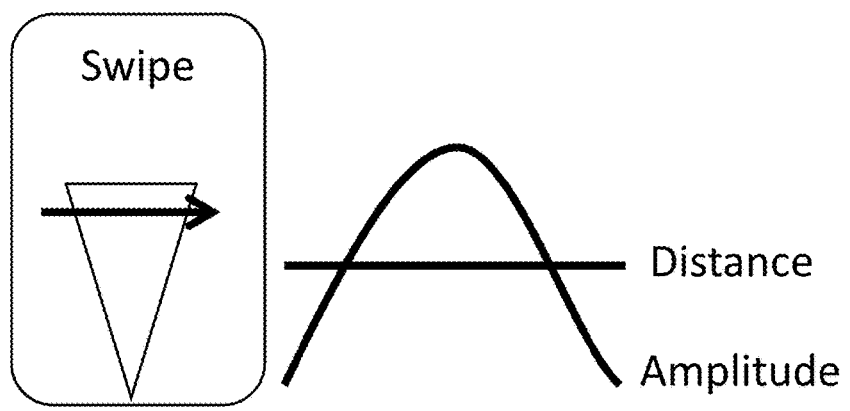

Reference is made to FIGS. 4A and 4B which shows some examples of gestures which the arrangement of some embodiments may detect. The first gesture is where a user may move their hand towards a detector and then away. Thus, the distance will decrease and then increase. The corresponding amplitude measurement is shown. Generally, the amplitude will be higher when the object, for example the user's hand, is closer to the detector.

A second example of a gesture which can be detected is a swiping gesture. With the swiping gesture, generally, the user's hand is at a relatively constant distance from the detector. The amplitude will have a similar profile to the up and down gesture. Using a ToF based detection system, as opposed to an intensity based detection system, allows the two gestures to be distinguished.

With gesture detection, it may not be necessary to determine exact distances. However, in some embodiments the distances may be determined with relative accuracy.

Figure 5:
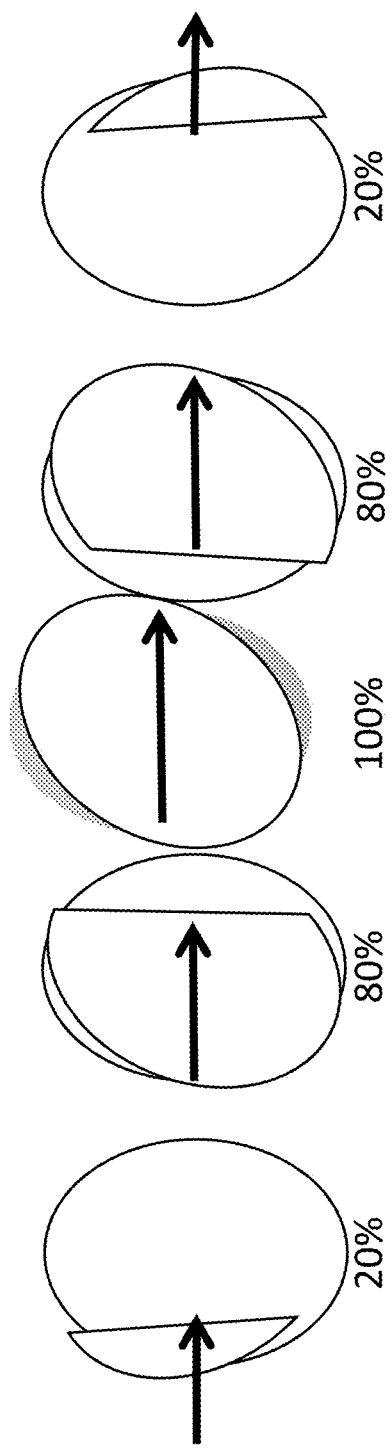
FIG. 5 shows lateral motion estimation.

Reference is made to FIG. 5 which shows a method for lateral motion estimation. Generally, as a user's hand moves passed a detector, the percentage of the field of view which is filled will change. This is represented schematically in FIG. 5. As the user's hand moved from left to right, the fill factor will gradually increase until a hundred percent of the field of view is filled by the object and then will decrease again. The percentage of the field of view filled by an object is generally independent of the object distance. It should be appreciated that the speed of gesture will determine the rate at which range information should be gathered.

This is determined based on the information from the various zones. The output from a particular zone will determine where the user's hand is in relation to that zone. Using the information from all the zones, taken at successive points in time, the course of an object can be determined and hence gesture recognized. Consider the following example of a user's hand moves across the array in the direction of zones A to D, the following information would be determined from the zones. Initially at time t1, only zones A and E would detect the moving hand. Then at t2, zones A, B, E and F would detect the moving hand. Then at time t3, zones A, B, C and E, F and G would detect the moving hand. At time t4, all zones would detect the user's hand. At time t5, zones B, C, D and F, G and H would detect the user's hand. At time t6, zones C, D and G and H would detect the user's the hand. At time t7, zones D and H would detect the user's hand. It should be appreciated that this is a simple example and the processor may be configured to analyze the data from each zone to determine if an object is being detected.

Figure 6:
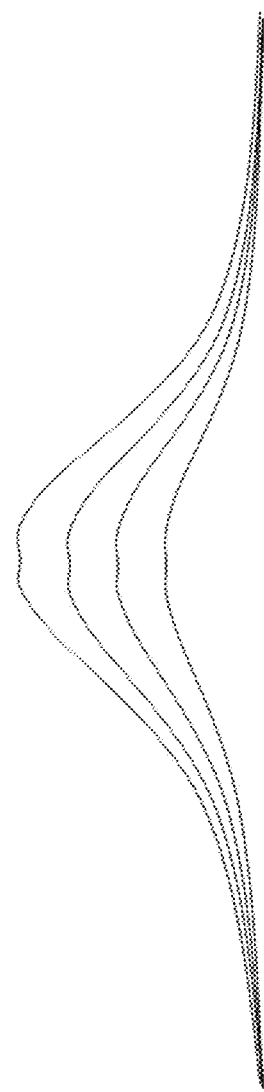
FIG. 6 shows normalized amplitude information.
Figure 11:
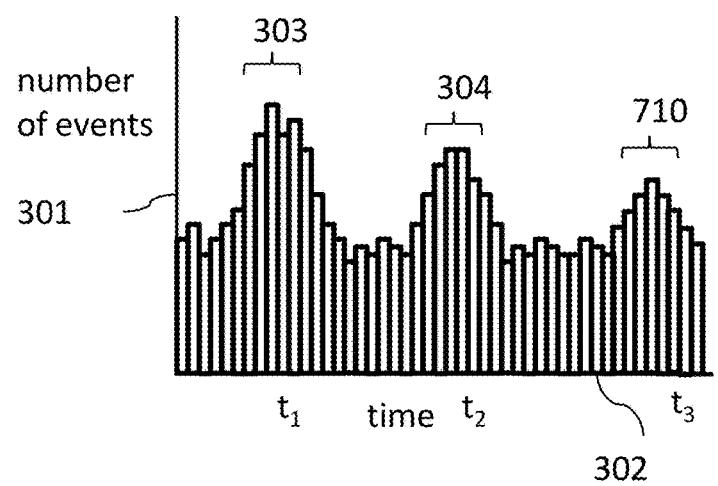

Reference is made to FIG. 6 which shows the normalization of the amplitude associated with measurements made for the movement shown in FIG. 11. The normalization uses for example distance information. The largest amplitude will be when the field of view is completely filled by the object. The lowest amplitude will occur when the movement is such that only 20% of the field of view is filled, for example at either end of the gesture movement.

Figure 7A:
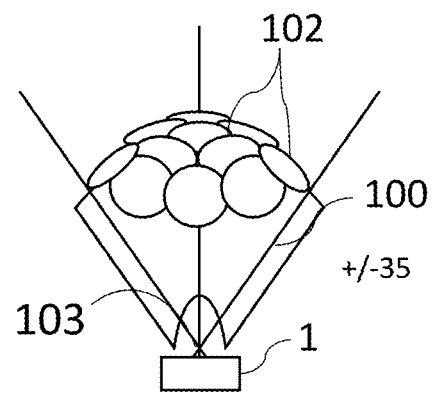
FIGS. 7A and 7B show a field of view of the SPAD array of FIG. 3.
Figure 7B:
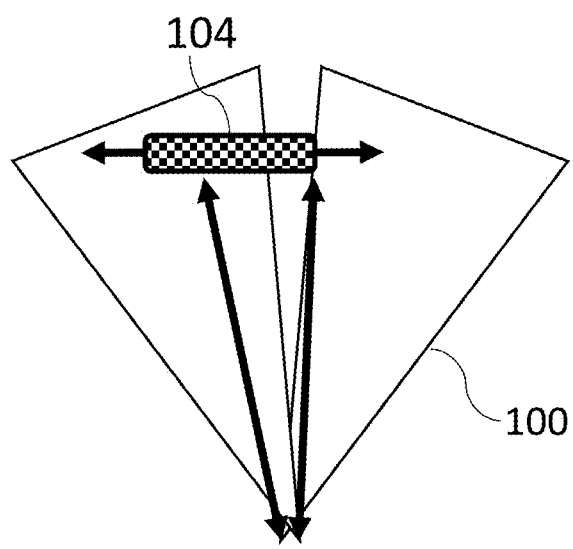
Figure 8:
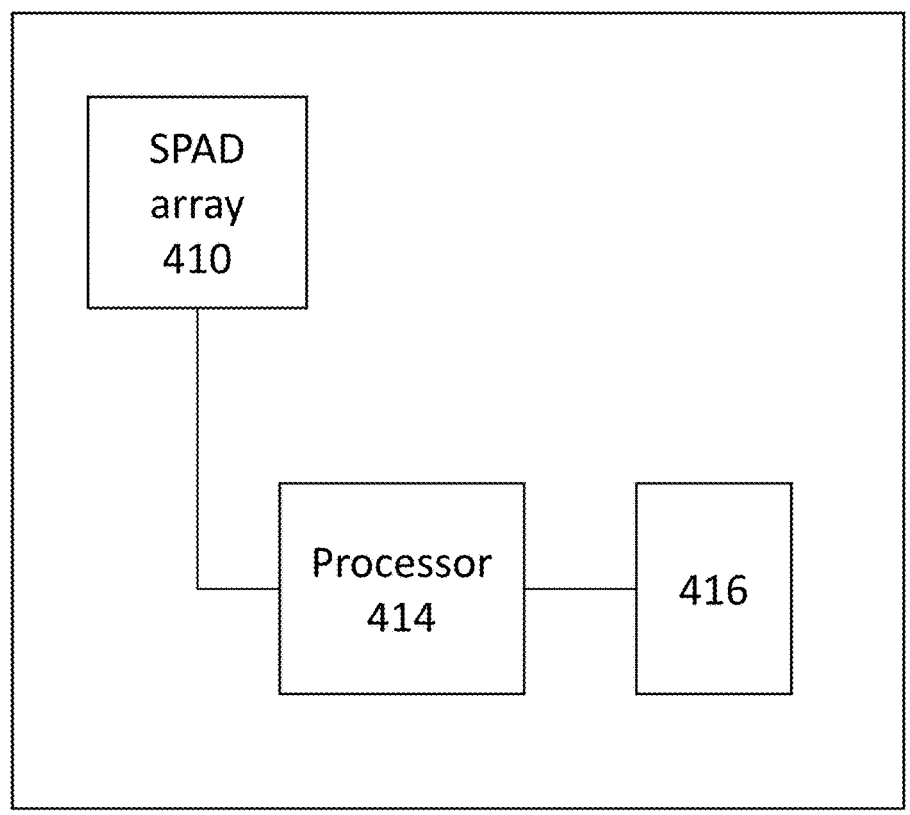
FIG. 8 shows a device with a SPAD array arrangement.

Reference is made to FIGS. 7A and 7B which schematically show the field of view 100 associated with the return array. It should be appreciated that the field of view may be controlled using a lens 103 over the array. However, this is optional. The areas marked 102 in the field of view represent the individual field of view associated with a respective zone. Thus each zone has its own field of view. The field of view from each zone then together make up the field of view of the array.

In the example shown, the field of view is around +/−35°. However, it should be appreciated that this is by way of example only and in other embodiments, a different field of view may be used. For example, the field of view may be between +/−40 to 70°.

In this example, the ranging distance may be up to around 40 cm. However, again this is by way of example only and smaller or larger ranges may be supported.

It should be appreciated that although the field of view for only one of the arrays is shown, the second array may also have a similar and overlapping field of view if it is also used as a return array. Additionally, the first and second arrays will have a known spacing. This will allow some precise positioning of objects to be achieved.

In some embodiments, the spacing between different zones of the array may be exploited to determine the position of an object which is detected by the different zones.

With some embodiments, it is possible for one or more targets in the field of view to be determined. As there are a plurality of zones which are read out in parallel, this may enable relatively complex and/or faster gestures to be identified. This also allows multiple targets to be tracked.

In some embodiments, the speed of a gesture i.e. the speed of a moving object may determine the rate at which range information may be gathered. The accuracy of a gesture system or the range of gestures that can be captured, including the minimum size of object that can be tracked may determine how many zones and/or the zone size that should be interrogated within the system field of view. It should be appreciated that for a time interleaved system, where zones are evaluated in series, the balance may need to be achieved between the number of zones that have to be evaluated serially, the slower the system is going to be in gathering a full data set. Accordingly, this may be one of the considerations which is taken into account when configuring the number of zones in the array and the number of read out channels.

Thus, embodiments may allow the range and signal rate from multiple areas within a field a few to be investigated in parallel. This can enable the detection of faster object tracking in a gesture system. This may enable more than one point of interest to be evaluated in a multi zone autofocus system.

In some embodiments, such as in gesture recognitions scenarios, accuracy of measurement may be sacrificed in favor of rate of capture of data. To increase accuracy, the number of readings taken is increased. If this is reduced, the time take to capture a set of data can be reduced.

Embodiments may have many different applications. For example, embodiments may be used in SPAD-based Time of Flight sensors for determining one or more of proximity, distance measurement, assisting autofocus and 3D imaging. Some embodiments may have application in gesture recognition or object tracking systems.

Some embodiments may be used in auto focus systems and/or may be used in systems which have a zoom with varying aperture. In this example, the range measurement accuracy may be relatively high.

Some embodiments may have infrared applications. The light source would be replaced by an infrared source and the detector array would be sensitive to infra-red radiation.

Figure 9:
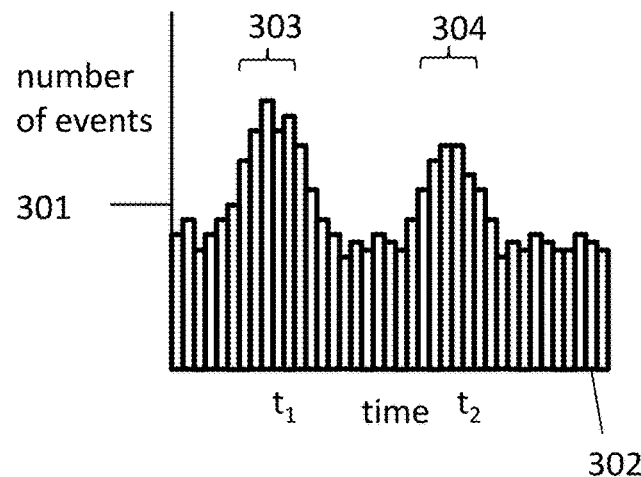
FIGS. 9 to 11 show examples of histogram produced in some embodiments.
Figure 10:
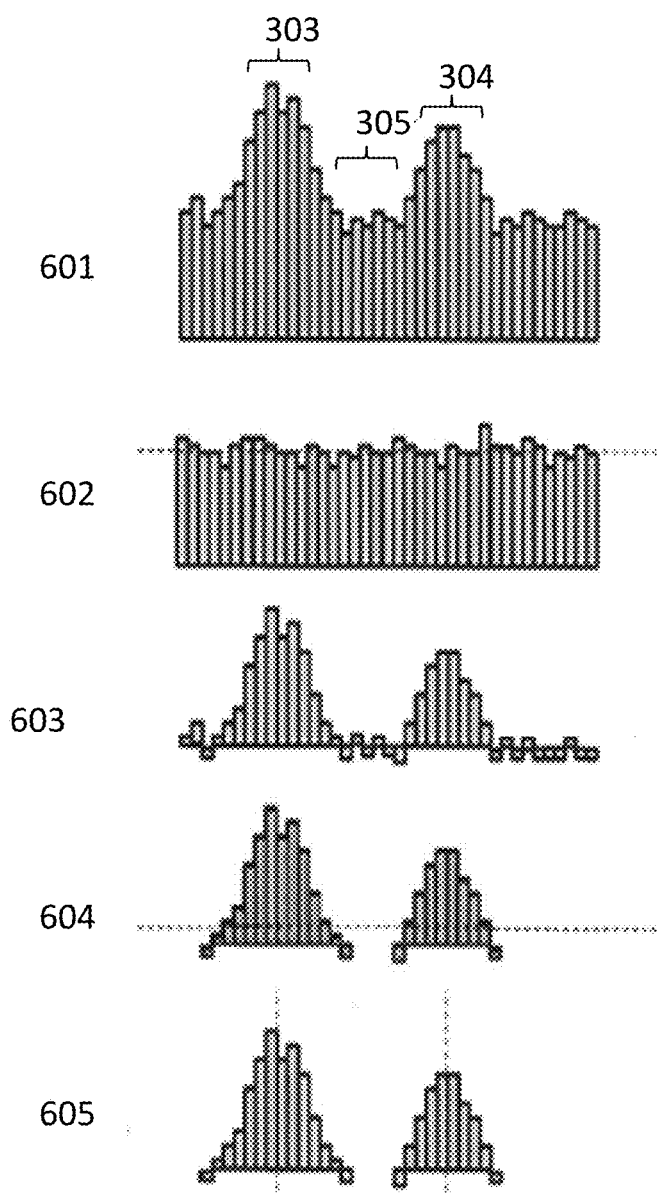

FIGS. 9 to 11 show histograms of light detected at one of the arrays with the number of events detected against time. As can be seen from FIG. 9 there is a first peak 303 of detected events at time t1 and a second peak 304 of events at time t2. These first and second peaks may be the result of the reflection of the emitted light from respective first and second objects.

It will be appreciated that the time t1 and the time t2 may be determined by a clock of the device. The time may be determined based on a timer that starts counting when a pulse of light is triggered (or by using information provided by the reference array) and records when the events occur of an event (the incidence of the reflected light). Information relating to a detected event and a time at which the event was detected may be passed to a time to digital converter which may provide a digital representation of the information. It may be appreciated that the time to digital converter may receive an indication of an event from the sensor array and provide a digital indication of the event along with a time. For example, the TDC (time to digital convertor) may be further coupled to a clock. The processor may receive these digital indications and build up a histogram depicting the number of events that have occurred at each time.

The processor may receive information that an event has occurred and a time at which the event has occurred. The processor may gather this information and use it to generate a histogram. It will be appreciated that in order to gather enough information to generate a histogram a plurality of light pulses may be emitted in the determination of a distance from the remote object. Event information may be detected for one or more of the plurality of pulses and the information may be combined by the processor to generate a histogram.

It will be appreciated that the information in the histogram of FIG. 9 may represent the events detected over a number of pulses.

It will be appreciated that the processor may trigger the start of a pulse. The time at which the pulse was triggered may be known, however due to driver reaction time and PVT (process, voltage, temperature) variations, the time at which the pulse is emitted is not accurately known. For each pulse, the time of the event 302 may be considered to be the time between the pulse being triggered and the event being detected. Thus, event information for each of a plurality of pulses may include an indication of an event and a time corresponding to a time period of between the triggering of a pulse the event occurring.

It will be appreciated that the number of events detected at the times surrounding t1 and t2 may not be null. This is because other incidences of light may occur onto the sensor. For example, light from other sources may be incident on the sensor and/or light having a longer reflection path may fall onto the sensor.

It will be appreciated that event data is gathered for each pulse period and then event data from all the pulse periods are combined. The emitter may emit a number of pulses during a detection period and data is gathered for each of the pulse periods in the detection period. For each pulse period time and event information comprising an indication of any event and an associated time (corresponding to a period of time between that pulse being triggered and an event detected) will be gathered for the events occurring during the pulse period. The time and event information for each pulse period will be combined to generate the histogram.

In this case, a pulse period may include both the period for which a light pulse occurs as well as a period of time between the pulse and the next pulse. In one example, a pulse may be 2 ns long and there may be a 10 ns break between pulses. In this example, the pulse period is 12 ns. It will however be appreciated that this is by way of example only and a pulse period may be chosen based on component capability and/or the distance desired to be detected and dependent on the application of the device.

Once the time and event information is gathered from the pulses in the detection period and the histogram is generated, the distance between the remote objects and the device may be determined from the time of the first peak 303 and the second peak 304. An average or mean time at which the first events occurred and an average or mean time at which the second events occurred may be determined and used to determine distance of the second object. It will be appreciated that different methods to detect the peaks may be used. For example, a highest number of events per time may be used to detect a peak or an average number of events per time period may be used.

It should be appreciated that histogram information may be gathered from each zone and used by the processor to determine the movement of an object.

Figure 12:
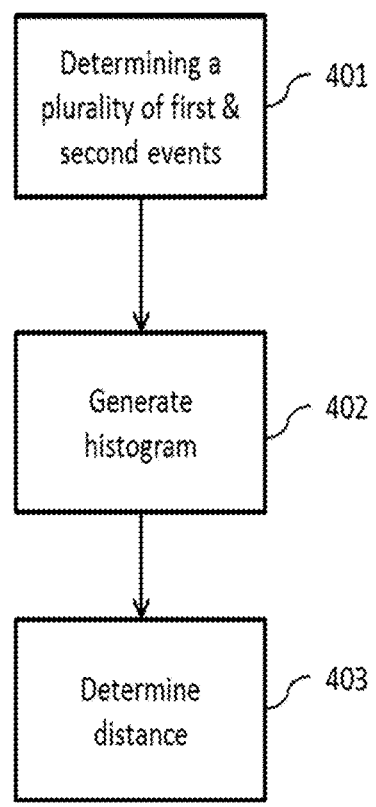
FIG. 12 is a flow diagram depicting the method steps associated with an embodiment.

FIG. 12 shows an example of the method steps that may be carried out in accordance with some embodiments.

At step 401, a plurality of first and second events are determined and a time at which each event occurred is recorded. It will be appreciated that the histogram may be updated as event data is received and thus event data is recorded in the histogram. It will also be appreciated that the event data may be recorded for a series of pulses in a detection period and the event time may be relative to each pulse.

At step 402, a histogram may be generated from the event information. It will be appreciated that in some embodiments, the histogram may be generated once the detection period has ended and based on all the time and event information for the detection period. In other embodiment the histogram may be generated during the detection period and updated as the time and event information is generated. In some embodiments the histogram may be generated by the processor in response to digital time information from the TDC. In other embodiments, the TDC may generate the histogram.

At step 403, the time of a first peak 303 corresponding to the first events and a second peak 304 corresponding to the second events of the histogram may be used to determine a time taken for light to travel to and from the respective remote objects.

It will be appreciated that at step 401 a series of light pulses may be used to generate enough event data to generate the histogram. FIG. 9 shows the method steps associated with the series of pulses according to some examples.

At step 501 of FIG. 1 a first pulse is triggered and a timer is reset at 502. It will be appreciated that the timer will be reset at the time at which the pulse is triggered and not necessarily at the time at which the pulse is actually emitted. It will also be appreciated that in some cases, these steps 501 and 502 will be carried out simultaneously.

At step 503, it is determined whether an event is detected by the array. If an event is detected, an indication of the detected event is passed to the TDC where an event time is recorded at step 504. It will be appreciated that the time may correspond to the timer and thus a time period from triggering the first pulse. The method then proceeds to step 505. If no event is detected at 503, the method will also proceed to step 505.

At step 505, it is determined if the pulse period has ended. In other words it is determined whether it is possible for more events to occur due to the first pulse or if it is time for a second pulse. The pulse period may for example include the time of the pulse as well as a time between pulses. If the pulse period has not ended, the method proceeds to step 503 where more events are detected and output.

If the pulse period has ended at 505, the method proceeds back to steps 501 and 502 where a second pulse may be generated. In this manner a series of pulses forming a detection period may be generated and event and time information for the detection period may be provided to be used to generate a histogram. The method of FIG. 5 will exit when all the pulses in the detection period have been generated.

A resulting histogram is built, with an example given in FIG. 10. In order to determine a time of a first peak 303 and a second peak 304, the processor is configured to determine the locations of the first and second peaks. It will be appreciated that the processor may detect the position of the peaks and hence the time between the first peak and the second peak in any suitable fashion, however FIG. 10 shows one example of such a determination.

Figure 13:
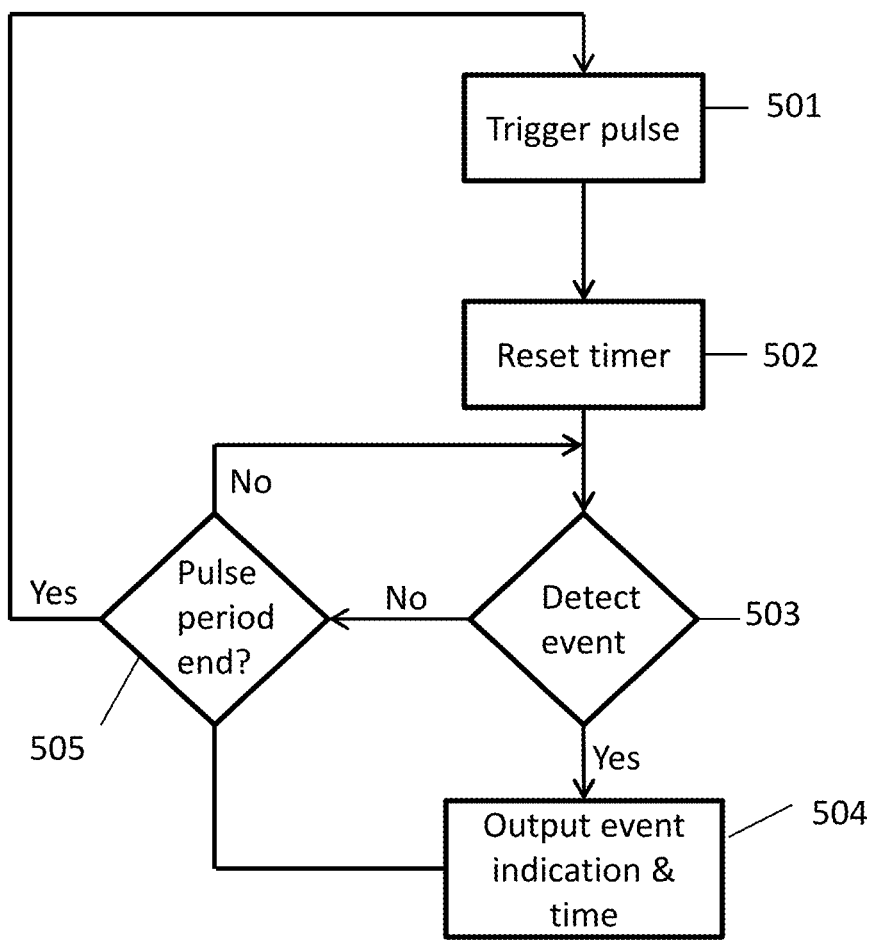
FIG. 13 is a flow diagram depicting the method steps associated with a further embodiment.

In the example of FIG. 10, four stages are carried out in the determination of a time difference between the first peak 303 and the second peak 304. A first stage 602 may occur prior to detection period and may comprise consist of building a histogram depicting an average event information triggered by ambient light. It will be appreciated that event with no triggered pulse, events may be detected on the array due to ambient light in the environment. In this example a separate timed sequence may be run with no light pulse emitted by the light emitter. A histogram may be generated by the processor showing the number of events against time detected under ambient light conditions. This is optional in some embodiments After the first stage, a histogram is generated in response to the detection period, such as described in relation to FIGS. 12 and 13. This may be a histogram as shown at 601. A second stage may occur after the generation of the histogram of FIG. 9 and is shown at 603. The second stage may comprise subtraction of the expected average events caused by ambient light from the event information in the histogram generated from the detection period. It will be appreciated that this may be done on a bin by bin basis.

A third stage may comprise thresholding and is shown at 604. In the third stage 604, the approximate locations or times of the first and second peaks is established. The processor may determine whether event information is unlikely to be due to a reflected pulse and remove such data from the histogram. For example, very low levels or negative amounts of detected events may be removed.

In the fourth stage, a center of each remaining discrete peak may be found through for example peak detection and/or by a center of mass calculation and is shown at 605.

In the example of FIG. 10, the first peak 303 and the second peak 304 may be separated in time. For example, there is a distinctive low 305 between the peaks 303 and 304.

However in some cases, for example where the objects are close together, the first and second peaks may overlap. In such cases, more complex algorithms may be used to resolve pulses overlapping in time. For example, the histogram data may be low pass filtered and then differentiated to detect a change in the response.

FIG. 11 give an example of embodiments where respective distances to three remote objects are determined. In this case, there will be three peaks—a first peak 303 due to the events triggered by reflection off the a first, a second peak 304 due to the events triggered by reflection off the second object and a third peak 710 due to the events triggered due to the reflection off the third object 701.

In some embodiments, targets at different depths in the field of view can be independently discerned and tracked.

It will be appreciated the while the foregoing describes an arrangement which relies on a pulsed input waveform, it should be other embodiments may utilize other techniques, for example using a light source emitting a sinusoidal waveform. In this example, during the detection period, the emitter may a light frequency and time and event information may be generated for each period of the emitted frequency until the end of a detection period.

It will be appreciated that embodiments of the disclosure may be implemented in a wide variety of applications. For example ranging data extracted from the return and reference peak subtraction according to embodiments could be used for a large number of applications including user detection, gesture recognition, object tracking, auto-focus assist and machine vision.

Some embodiments have been described in the context of using a histogramming technique. However, this is only one way of analyzing the outputs from the zones of the arrays. In other embodiments, different techniques may be used to analyze the outputs form the zones of the arrays.

It will be appreciated that in some embodiments, the array may be a single photon avalanche diode array. It will be appreciated that a photon of light (as part of the light emitted from the emitter) may trigger an avalanche current in a SPAD and thus cause an output of an indication of an event.

In the foregoing a light emitter has been described. It will be appreciated that in some embodiments, the emitter may be a vertical surface cavity emitting laser (VSCEL) and may be driven by a VSCEL driver. However, it will be appreciated that this is by way of example only and other suitable emitters may be used.

Some embodiments may be provided in a device 400 such as shown in FIG. 4. The device 400 may comprise a plurality of SPAD arrays as previously described and referenced 410. An output from the SPAD arrangement may be provided to a processor 414. Based on the output provided by the processor an information or control signal may be output to function block 416. The function block may be a controller which is configured to cause one or more actions in response to detecting a presence of an object. The function block may be a display which is configured to display a measurement result. The processor may be configured to identify one or more gestures from the information provided from the SPAD arrays.

It should be appreciated that the device may be any suitable device. By way of example only and without limitation, that device may be a mobile telephone, smart phone, tablet, computer, measuring device, switch controller such as for a light, controlling a water supply such as in a tap or toilet, door controller, distance sensor, impact controller, or any other suitable device.

Some embodiments may use other sensors, instead of SPADs. These sensors may be integrating elements generating events on reception of the light information. Some embodiments may use any photon sensitive detector.

It should be appreciated that the above described arrangements may be implemented at least partially by an integrated circuit, a chip set, one or more dies packaged together or in different packages, discrete circuitry or any combination of these options.

For example the detector and optionally the processor may be provided on an integrated circuit or die. The detector and optionally the processor may be packaged in a module with the light emitter.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

The invention claimed is:

1. A ranging apparatus, comprising:
    a first array of a plurality of light sensitive detectors configured to receive light from a light source which has been reflected by an object;
    a first addressing circuit configured to simultaneously define, during operation of said ranging apparatus, a plurality of zones within said first array and further dynamically define a position of each zone of the simultaneously defined plurality of zones in the first array and a number of light sensitive detectors that are included within each zone of the simultaneously defined plurality of zones;
    readout circuitry having at least one read out channel, said readout circuitry configured to read out data from each zone of said simultaneously defined plurality of zones; and
    a processor configured to determine position information associated with said object in dependence on said outputs from the first array.

2. The ranging apparatus as claimed in claim 1, wherein said first array comprises a field of view, with each zone being associated with a sub area in said field of view, said processor further configured to determine a position of said object with respect to one or more of said sub areas.

3. The ranging apparatus as claimed in claim 1, wherein said processor is further configured to determine movement of said object by using successive data output by said zones.

4. The ranging apparatus as claimed in claim 1, wherein said first addressing circuit defines the first array to include n zones and wherein said readout circuitry comprises n readout channels.

5. The ranging apparatus as claimed in claim 1, wherein said first addressing circuit defines the first array to include n zones and wherein said readout circuitry comprises m readout channels, where m is less than n, said readout circuitry configured to serially readout from at least two zones of said first array.

6. The ranging apparatus as claimed in claim 1, further comprising a second array, said second array configured to provide a reference value, said readout circuitry configured to read out data from said second array.

7. The ranging apparatus as claimed in claim 6, wherein said second array comprises a plurality of different zones.

8. The ranging apparatus as claimed in claim 7, wherein said second array comprises a same number of zones as the first array.

9. The ranging apparatus as claimed in claim 1, wherein said light sensitive detectors comprise SPADS.

10. The ranging apparatus as claimed in claim 1, further comprising said light source configured to emit light.

11. A ranging apparatus, comprising:
    an array including a plurality of light sensitive detectors, each light sensitive detector configured to receive light from a light source which has been reflected by an object;
    an addressing circuit configured to simultaneously define a plurality of different zones within said array, with each zone including light sensitive detectors;
    said addressing circuit further configured to dynamically define, during operation of said ranging apparatus, the number of light sensitive detectors that are included within each zone;
    a logic circuit configured to select data output from the light sensitive detectors of a selected one of said zones;
    a multiplexing circuit configured to direct the selected data to one of a plurality of channel banks.

12. The apparatus of claim 11, further comprising a processor configured to determine position information for object in dependence on the data stored within said channel banks.

13. The apparatus of claim 11, wherein the logic circuit comprises an OR circuit configured to logically OR output from the array so as to pass the data output from the addressed light sensitive detectors of the selected zone.

14. The apparatus of claim 11, wherein said array comprises a field of view, with each zone being associated with a sub area in said field of view, said processor further configured to determine a position of said object with respect to one or more of said sub areas.

15. The apparatus of claim 11, wherein said processor is further configured to determine movement of said object by using successive data output from the light sensitive detectors of one or more selected zones.

16. The apparatus of claim 11, wherein said light sensitive detectors comprise SPADS.

17. The apparatus of claim 11, wherein a number of channel banks equals a number of zones in said array.

18. A ranging apparatus, comprising:
a first array of a plurality of light sensitive detectors configured to receive light from a light source which has been reflected by an object, said first array comprising a first plurality of zones;
a second array of a plurality of light sensitive detectors configured to receive light from the light source which has been reflected by the object, said second array comprising a second plurality of zones;
wherein the first and second arrays are separated by an interspatial distance;
readout circuitry including a plurality of read out channels, said readout circuitry configured to read out data from each zone of said first plurality of zones and each zone of said second plurality of zones; and
a processor configured to determine a distance to said object by stereoscopic perspective using the data in the plurality of read out channels that is read out from the first plurality of zones in the first array and read out from the second plurality of zones in the second array.

19. The ranging apparatus as claimed in claim 18, wherein the first and second arrays cover an overlapping field of view, with each zone being associated with a sub area in said overlapping field of view.

20. The ranging apparatus as claimed in claim 18, wherein said processor is further configured to determine movement of said object by using successive data output by said zones.

21. The ranging apparatus as claimed in claim 18, wherein each of said first and second arrays comprises n zones and said readout circuitry comprises m readout channels, m and n both being integers.

22. The ranging apparatus as claimed in claim 21, wherein m is less than n.

23. The ranging apparatus as claimed in claim 21, wherein m is equal to n.

24. The ranging apparatus as claimed in claim 18, wherein said light sensitive detectors comprise SPADS.

25. The ranging apparatus as claimed in claim 18, further comprising address circuitry configured to dynamically define, during operation of said ranging apparatus, said plurality of different zones within said first and second arrays by setting a position of each zone in the array and a number of light sensitive detectors that are included within each zone.

26. The ranging apparatus as claimed in claim 18, further comprising a light source configured to emit said light source emission.

* * * * *